(12) United States Patent
Deimling (10) Patent No.: US 8,890,523 B2
(45) Date of Patent: Nov. 18, 2014

(54) MAGNETIC RESONANCE IMAGING METHOD, SYSTEM AND COMPUTER-READABLE STORAGE MEDIUM

(75) Inventor: Michael Deimling, Moehrendorf (DE)

(73) Assignee: Siemens Aktiengesellschaft, Munich (DE)

( * ) Notice: Subject to any disclaimer, the term of this patent is extended or adjusted under 35 U.S.C. 154(b) by 543 days.

(21) Appl. No.: 13/249,873

(22) Filed: Sep. 30, 2011

(65) Prior Publication Data

US 2012/0081112 A1   Apr. 5, 2012

(51) Int. Cl.
*G01R 33/54* (2006.01)
*G01R 33/34* (2006.01)
*G01R 33/565* (2006.01)
*G01R 33/561* (2006.01)

(52) U.S. Cl.
CPC ...... *G01R 33/56509* (2013.01); *G01R 33/5614* (2013.01)
USPC ............................ 324/309; 324/307; 324/318

(58) Field of Classification Search
CPC ....................... G01R 33/56509; G01R 33/5614
USPC .................................................. 324/307, 309
See application file for complete search history.

(56) References Cited

U.S. PATENT DOCUMENTS

| | | | |
|---|---|---|---|
| 2004/0113613 A1 | 6/2004 | Markl et al. | |
| 2004/0189297 A1* | 9/2004 | Bock et al. | 324/307 |
| 2006/0161060 A1 | 7/2006 | Pai | |
| 2008/0061780 A1* | 3/2008 | Yamada et al. | 324/309 |
| 2009/0134871 A1 | 5/2009 | Yui | |
| 2010/0109665 A1 | 5/2010 | Nielsen et al. | |
| 2010/0280357 A1 | 11/2010 | Bi et al. | |

OTHER PUBLICATIONS

"Flow Compensation in Balanced SSFP Sequences," Bieri et al., Magnetic Resonance in Medicine, vol. 54 (2006) pp. 901-907.
"Handbook of MRI Pulse Sequences," Bernstein et al., Chapter 10.4, Gradient Moment Nulling, pp. 331-349 (2004).

* cited by examiner

*Primary Examiner* — Melissa Koval
*Assistant Examiner* — Rishi Patel
(74) *Attorney, Agent, or Firm* — Schiff Hardin LLP (57) ABSTRACT

In a magnetic resonance method and system to acquire an MR image using a pulse sequence that sets the magnetization vector in the steady state into a stable oscillation under RF excitation pulses radiated at a time interval of time TR, the phase coding gradients for coding a k-space line in k-space of the pulse sequence (which k-space corresponds to the desired MR image) are switched such that the first moment of the phase coding gradient is minimal at the point in time of the radiation of an RF excitation pulse without the repetition time TR being extended relative to pulse sequences with unminimized phase coding gradients.

6 Claims, 5 Drawing Sheets

FIG 6 though it is a structural characteristic of a FISP sequence or, respectively, of an SSFP sequence that TR is shorter than T1 and T2 of the imaged tissues.

MAGNETIC RESONANCE IMAGING METHOD, SYSTEM AND COMPUTER-READABLE STORAGE MEDIUM

BACKGROUND OF THE INVENTION

1. Field of the Invention

The invention concerns a method to acquire an MR image with a magnetic resonance system by means of a pulse sequence, a corresponding magnetic resonance system, and a corresponding electronically readable data storage medium.

2. Description of the Prior Art

Magnetic resonance (MR) is a known modality with which images of the inside of an examination subject can be generated. Expressed in simple terms, the examination subject is positioned in a strong, static, homogeneous basic magnetic field B0 (field strengths from 0.2 to 7 Tesla or more) in a magnetic resonance apparatus so that nuclear spins in the subject orient along the basic magnetic field. For spatial coding of the measurement data, rapidly switched gradient fields are superimposed on the basic magnetic field. To trigger nuclear magnetic resonances, radio-frequency excitation pulses (RF pulses) are radiated into the examination subject by means of at least one transmission coil, the triggered nuclear magnetic resonances (signals) are measured by reception coils, and MR images (for example) are reconstructed on the basis of the measured signals. The magnetic flux density of these RF pulses is typically designated with B1. The pulse-shaped radio-frequency field is therefore generally also called a B1 field for short. The nuclear spins of the atoms in the examination subject are thereby excited by these radio-frequency pulses such that they are deflected out of their steady state parallel to be basic magnetic field B0 by what is known as an "excitation flip angle" (also called a "flip angle" in the following for short). The nuclear spins then precess around the direction of the basic magnetic field B0. The magnetic resonance signals that are thereby generated are acquired by radio-frequency reception antennas. The measurement data acquired in such a manner are digitized and stored as complex numerical values (also called raw data) in a k-space matrix. By means of a multidimensional Fourier transformation of the values of the k-space matrix, the measurement signals can be calculated to form image data in order to reconstruct an associated MR image from the k-space matrix populated with values. In addition to anatomical images, spectroscopy data, movement data or temperature data of an examined or treated area can be determined with the aid of the magnetic resonance technique.

The manner of the excitation of the spin echoes and their acquisition is controlled by different sequences (known as pulse sequences) that specify the chronological order of the RF pulses and gradients for excitation and spatial coding, as well as the acquisition of the measurement signals.

Depending on the desired contrast, various pulse sequences are used in order to excite and acquire the measurement signals. One known sequence is the (true)FISP sequence ("Fast imaging with steady state precession"). Not only the steady state of the longitudinal magnetization, but also a steady state for the transverse magnetization, is utilized with this sequence. Spin echo components likewise contribute to the image contrast because each excitation pulse also acts as a refocusing pulse. Unfortunately, this sequence construction is prone to artifacts given the use of echo times that are longer than has previously been typical.

Typical, more robust variants of this sequence type are limited to rephasing only the dephasing (due to the phase coding gradients) that are used for the purposes of spatial coding, after the end of the data acquisition.

FISP is only one acronym used for this sequence type. Other known acronyms for this sequence type are GRASS ("Gradient Recalled Acquisition into Steady State") and FIESTA ("Fast Imaging Employing STeady state Acquisition") or T2-FFE ("Fast Field Echo, T2-weighted") or, respectively, bFFE ("balanced Fast Field Echo").

As imaging methods, sequences of the FISP sequence type have expanded into many fields of application, for example orthopedics, cardiology, colonoscopy, real time imaging etc. They have become a standard sequence for cardio MR (MR imaging of the heart), in particular due to the inherently high blood signal achieved by this sequence type. Particular advantages of this sequence type are a short measurement time per slice, a high signal-to-noise ratio (SNR) in many tissue types and an ideal detail imaging given the use of a conventional k-space scan.

For this sequence type, it is necessary to generate and to maintain the condition known as a "steady state" more precisely a "steady-state free precession" (SSFP) state, i.e. a state in which the magnetization vector is in the equilibrium state. To maintain this state, it is necessary to completely rephase the magnetization at the end of the sequence again at the point in time of the RF excitation pulse. This is achieved by switching (activating) the gradients along all three axes such that the zeroth moment (the integral of the gradient g over time, $M0(t):=\int_0^t g(\tau)d\tau$) is exactly zero at every RF excitation pulse, thus also after a time TR (repetition time) after an RF excitation pulse. If this gradient area described by the zeroth moment is not zero at the point in time of the repetition time TR, this leads to severe image artifacts, known as "banding artifacts". SSFP sequences that allow the zeroth moment at the repetition times TR to disappear (and therefore are less prone to such artifacts) are also designated as b-SSFP ("balanced steady-state free precession") sequences.

In the article by O. Bieri and K. Scheffler "Flow Compensation in Balanced SSFP Sequences", Mag. Res. Med 54, pp. 901-907, 2005, two methods are compared for reducing negative effects (such as signal losses and image artifacts) from a possible non-constant phase development of moving spins during an excitation. One of the methods involves a pairing of successive phase coding steps. The other method uses completely movement-compensated pulse sequences, i.e. pulse sequences whose phase coding gradients are designed such that their first moment $M1(t):=\int_0^t g(\tau)\cdot\tau d\tau$ (the integral of the product of gradient g and the time over the time) disappears at every excitation pulse. However, in order to achieve this disappearance, the repetition times TR between two excitation pulses must be extended such that the gradient shapes required for this can be temporally accommodated (see for example FIG. 2 of the article by Bieri and Scheffler).

Methods to generate movement-compensated phase coding gradients are specified in, for example, Chapter 10.4 "Gradient Moment Nulling" (P. 331 through 349) in the "Handbook of MRI Pulse Sequences" by Bernstein, King and Zhou, Elsevier Inc., 2004.

SUMMARY OF THE INVENTION

An object of the present invention is to design the acquisition of an MR image with a magnetic resonance system to be more robust against interferences in the signal acquisition and image quality, using a pulse sequence that sets the magnetization vector in in a stable oscillation in the steady state under RF excitation pulses radiated at a time interval of time TR, without losses in the acquisition time.

In accordance with the present invention, in a method to acquire an MR image with a magnetic resonance system using a pulse sequence that sets the magnetization vector in the steady state into a stable oscillation under RF excitation pulses radiated at a time interval of time TR, the phase coding gradients for coding a k-space line in k-space of the pulse sequence (which k-space corresponds to the desired MR image) are switched such that the first moment of the phase coding gradient is minimal at the point in time of the radiation of an RF excitation pulse, without the repetition time TR being extended relative to pulse sequences with unminimized phase coding gradients.

By the minimization of the first moment according to the invention, the SSFP state can be largely maintained at least in the region of low k-space lines. The measurement data measured in this region are responsible for the contrast of the MR image ultimately reconstructed from all measurement data. Due to movement in the high k-space positions, the effect of dephased spin isochromats—thus distorted SSFP states—is therefore of lesser importance to the reconstructed MR image. A marked improvement in the image quality of the reconstructed MR images is thus achieved via the method according to the invention due to the reduction of artifacts and the maintenance of the signal strength without having to extend the total measurement time, which would have a negative effect on the profitability [cost-effectiveness] of the method.

The invention also encompasses a magnetic resonance system having a magnetic resonance data acquisition unit and a control unit that is configured to operate the data acquisition unit to implement any and all embodiments of the method described above.

The invention also encompasses a non-transitory computer-readable storage medium that, when loaded into the computerized control unit of a magnetic resonance system, causes the magnetic resonance system to implement the method described above, including any and all embodiments.

DESCRIPTION OF THE PREFERRED EMBODIMENTS

Figure 1:
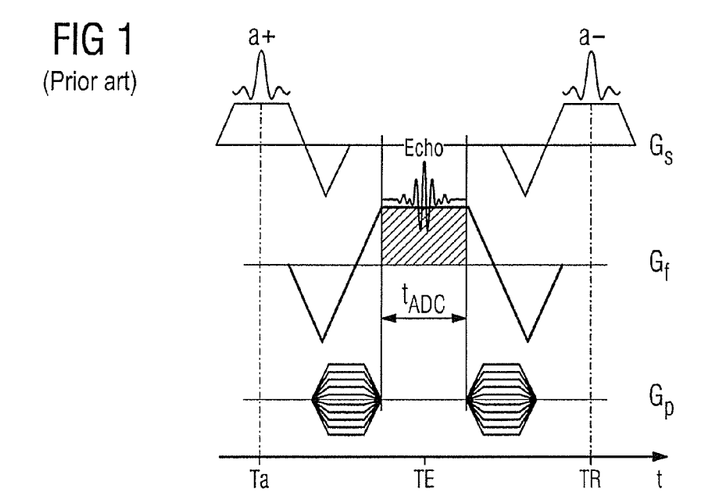
FIG. 1 schematically shows a known balanced trueFISP sequence with associated moments.

FIG. 1 schematically shows a known balanced trueFISP sequence. Time is indicated on the axis from left to right. At a point in time Ta an excitation/refocusing pulse α+ is radiated, wherein a slice selection gradient $G_s$ has already been switched in the slice direction to select a slice to be measured. At a later point in time TE (the echo time) after the excitation/refocusing pulse α+, an echo signal "echo" forms that is read out during the readout time period $t_{ADC}$ while a readout gradient $G_f$ is switched in the frequency coding direction. At another later point in time TR that corresponds to double the echo time TE after the excitation/refocusing pulse α+, an excitation/refocusing pulse α− is radiated again, with a phase coding gradient $G_p$ being activated between the excitation/refocusing pulse α+ and the excitation/refocusing pulse α− in order to complete the spatial coding. During the course of such a trueFISP sequence, alternating excitation/refocusing pulse α+ and α− are respectively radiated under the indicated gradients after the passage of the repetition time TR in order to maintain the steady state (as described above), with the phase coding gradient $G_p$ being (as schematically indicated) varied at each repetition in order to respectively scan, in each repetition, a different portion of k-space—for example a different respective k-space line—corresponding to the imaging area which should be shown in the desired MR image.

Figure 2:
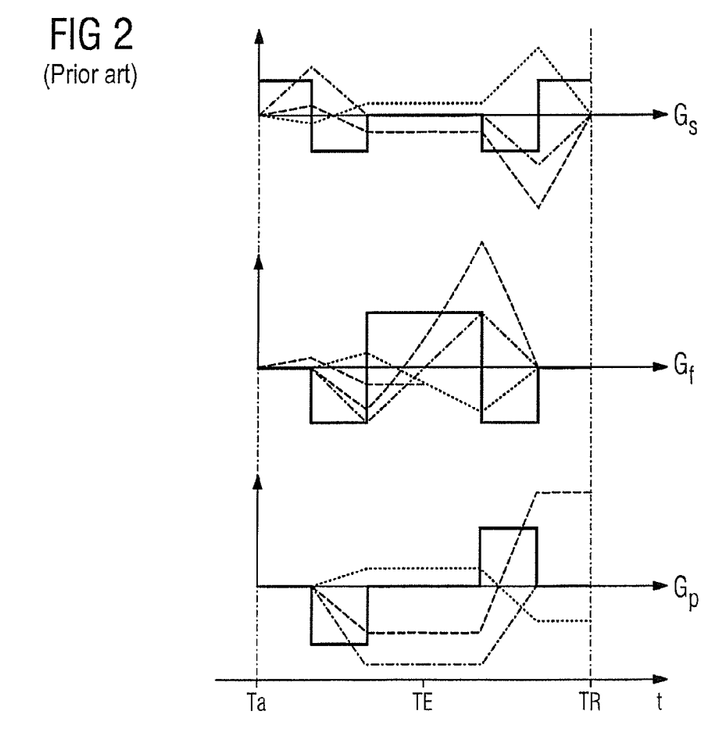
FIG. 2 is a simplified presentation of the gradients from FIG. 1 with associated moments.

Idealized (i.e. orthogonal gradients $G_S$ (slice selection gradient), $G_F$ (readout gradient) and $G_P$ (phase coding gradient) that correspond to the gradients from FIG. 1) are respectively shown as solid lines in FIG. 2. In addition to this, the associated phase curve of stationary spins $\Phi_0(t)=2\pi\gamma xM0(t)$ (which phase curve is dependent on the associated zeroth moment) is respectively shown as a dash-dot line and two respective phase curves of moving spins $\Phi_1(t)=2\pi\gamma vM1(t)$ (which phase curves are dependent on the associated first moment) which move with different velocity and direction are shown as dashed and dotted lines, wherein x is the location of an observed stationary spin and v is the velocity and direction of an observed moving spin.

As is apparent, the phase curves of stationary spins for all three gradients $G_S$, $G_F$ and $G_P$ (respectively the dash-dot line) at the point in time TR are each zero, meaning that the phases are coherent and the SSFP sequence is a bSSFP sequence.

Furthermore, the phase curves of moving spins (respectively the dotted and dashed lines) for the slice selection gradient $G_S$ and the readout gradient $G_F$ are equal to zero at the point in time TR. This is due to the disappearing integral over the gradient switching—which is mirror-symmetrical around the echo time TE=TR/2—in the slice coding direction and frequency coding direction. The usable, additional property of an inherent movement compensation in the slice and frequency coding direction thus automatically results here, meaning that the first moment $M1(t):=\int_0^t g(\tau)\cdot\tau d\tau$ also disappears in these directions.

However, this is not the case in the phase coding direction, with the exception of the (k=0) position for which g=0 applies. The phase coding gradient GP is not (mirror-) symmetrical around TE and the phase curves of moving spins, and therefore the first moment in this direction does not disappear at the point in time TR.

It is known that slight, aperiodic interferences, for example CSF (cerebrospinal fluid) pulsation, or similar aperiodic movements in the imaging area, already lead to the complete loss of the SSFP magnetization given refocused, non-RF-spoiled gradient echo sequences (FISP, for example), and therefore to the aforementioned artifacts and signal losses.

Figure 3:
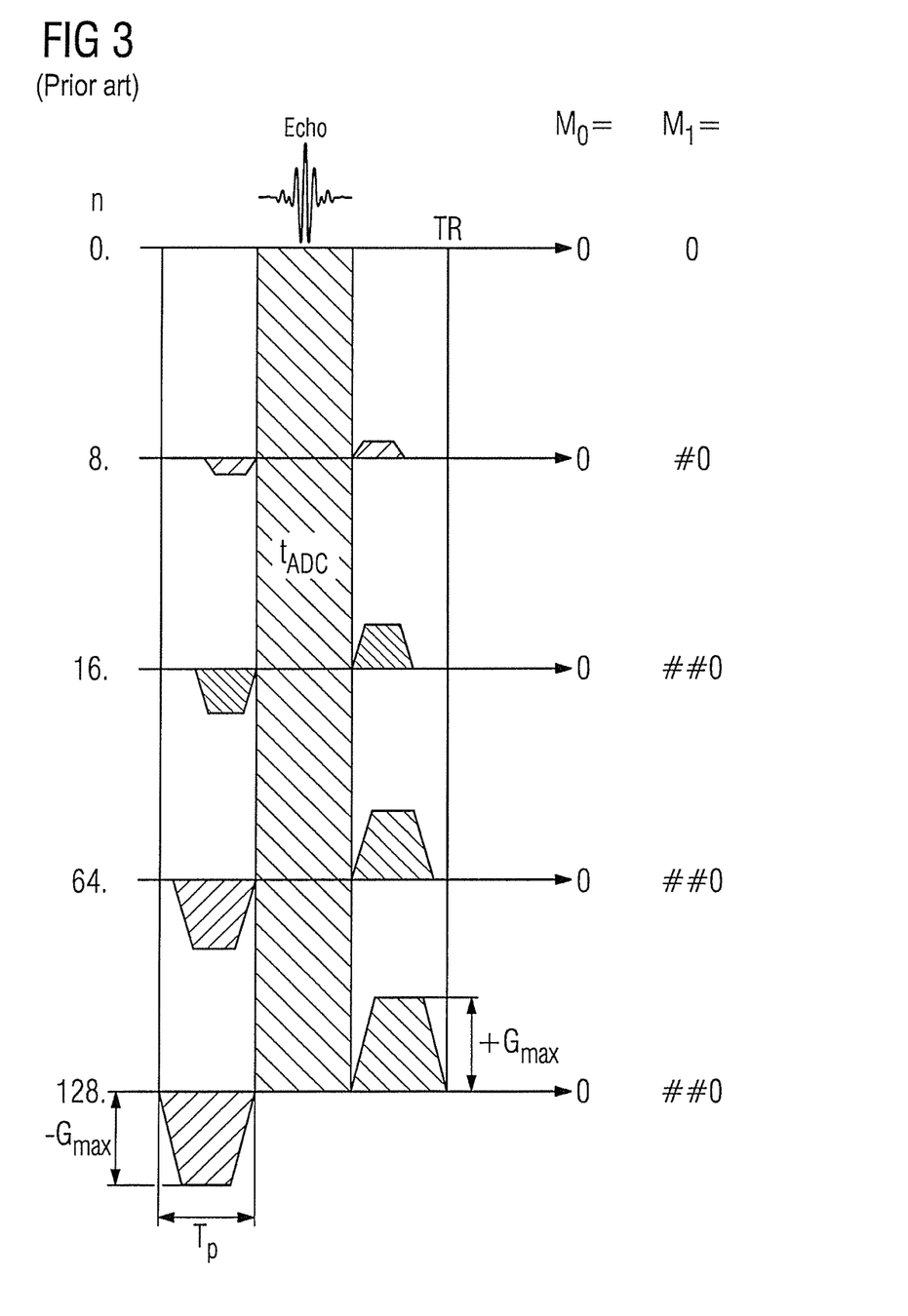
FIG. 3 schematically shows a conventional phase coding switching corresponding to a pulse sequence, for example according to FIGS. 1 and 2.

The conventional phase coding switching is schematically shown for stationary and flowing material in FIG. 3: the phase coding switchings corresponding to increasing k-space position n in excerpts (n=0, 8, 16, 64, 128) is plotted at the bottom, wherein the phase coding gradient associated with the k-space position n codes the n-th k-space line from the k-space center in the phase coding direction. With increasing k-space position the first moment is very large at the point in time TR since here the gradient $g(t)=G_P(t)$ is large. The correspondingly increasing degree of SSFP interference is represented in FIG. 3 by the "values" for M1=0 (no interference), ~0 (slight interference), #0 (strong interference) and ##0 (very strong interference), indicated in the column to the far right.

In such pulse sequences with unminimized phase coding gradients, the repetition time TR is to be chosen as short as possible in order to keep the total measurement time (TR times the number of k-space positions to be measured) as short as possible. For example, for this the maximum phase coding gradient amplitude $G_{max}$ of the gradient unit of the magnetic resonance system that is used is drawn upon for the highest (in terms of magnitude) k-space position $n_{max}$ (for example $|n_{max}|=128$ in FIG. 3) in order to calculate the time duration $T_P$ for which a maximum phase coding gradient must be switched in order to achieve the k-space position $n_{max}$, wherein it applies that: $n_{max}=T_P*G_{max}$. The minimum repetition time TR can thus be calculated as $TR=2*T_P+t_{ADC}$.

Figure 4:
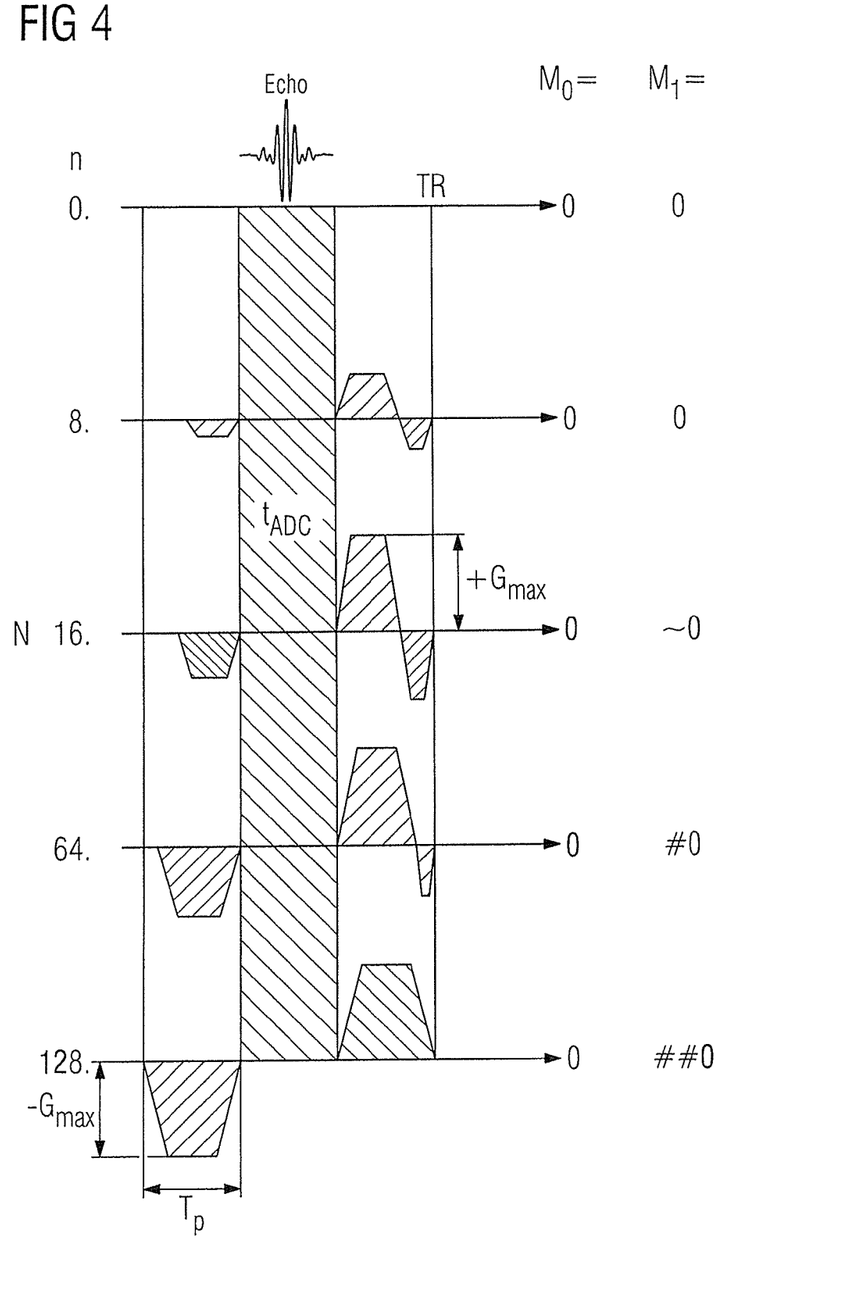
FIG. 4 schematically shows a phase coding switching with a movement compensation in the phase direction according to the invention.

The corresponding phase coding switching from FIG. 3 is shown in FIG. 4, but with movement compensation in the phase coding direction according to the invention. The shown phase coding direction maintains the SSFP state at least in a region of low k-space lines since the phase coding gradients for coding a k-space line in k-space of the pulse sequence (which k-space corresponds to the desired MR image) are switched (activated) such that the first moment of the phase coding gradient is minimal at the point in time of the radiation of an RF excitation pulse (thus at every point in time TR) without the repetition time TR being extended relative to pulse sequences with unminimized phase coding gradients.

The corresponding degree of SSFP interference is also represented in FIG. 4 by the "values" for M1=0 (no interference), ~0 (slight interference), #0 (strong interference) and ##0 (very strong interference), indicated in the column to the far right. As can be noted given a comparison of the degrees of SSFP interference from FIG. 3 and from FIG. 4, with a switching of the phase coding gradients according to the invention the degree of SSFP interference can be kept markedly lower—primarily in the region of the lower k-space positions n—than given a conventional switching of the phase coding gradients.

The phase coding gradients can thereby be switched in a known manner (see for example the already cited Chapter 10.4 of the "Handbook of MRI Pulse Sequences") like typical movement-compensated gradients, such that the first moment M1 disappears at the point in time TR, at least in a region of low k-space lines (n is smaller than or equal to a threshold N depending on the repetition time TR). No SSFP loss thus arises in the image reconstructed from the measurement data obtained in such a manner.

However, since—in order to not extend the total measurement time (which would reduce the profitability of the method)—the repetition time TR should not be lengthened relative to pulse sequences with unminimized phase coding gradients, given increasing k-space position the gradient amplitudes that are necessary for a movement-compensated switching can, as of a certain k-space position n>N, by necessity theoretically exceed a maximum value (provided by the hardware) of the gradient amplitude $G_{max}$, wherein it applies that $G_{max}=\pi*(n_{max}-1)/(2\pi\gamma*FoV*T_p)$, with FoV (measurement field; "field of view"), γ equal to the gyromagnetic ratio and $T_P$ equal to the duration that the gradient is switched, for example $T_p=(TR-t_{ADC})/2$ (see also FIG. 3).

However, since the maximum value of the amplitude of the phase coding gradients $G_{max}$ cannot be exceeded, as of this k-space position N (as of k-space position n=16 in FIG. 4, for instance) a complete compensation is no longer possible, meaning that as of the k-space position N the first moment of the phase coding gradient no longer disappears at TR but rather grows continuously with n insofar as n is greater than the threshold N.

However, the phase coding gradients are furthermore switched such that the first moment is minimal at the point in time TR. The compensation scheme is thus continuously reduced in order to keep the first moment M1 at the point in time TR at least as small as possible without having to exceed the maximum gradient amplitude $G_{max}$. As of the k-space position N, the phase coding gradient switching can thus no longer cause the first moment to disappear at the point in time TR; rather, it is only minimized.

By the continuous reduction of the compensation, an adaptive transition results between completely movement-compensated k-space portions and the k-space portions that are no longer to be completely compensated, wherein the first moment M1 is maximum only at the highest k-space position $k_{max}$ ($k_{max}=128$ in FIG. 4) or, respectively, at the lowest k-space position ($k_{min}=-k_{max}$) and completely corresponds to an uncompensated phase coding gradient.

The threshold N is dependent on the repetition time TR since this limits the time available for the switching of the phase coding gradients.

The threshold N is additionally dependent on the maximum phase coding gradient amplitude $G_{max}$ of the gradient unit of the magnetic resonance system that is used because this maximum phase coding gradient amplitude $G_{max}$ can also not be exceeded in the compensation scheme.

In practice the interference with the SSFP state (which thus still occurs only at higher k-space positions) can be accepted since the significant contrast in MR imaging is determined by the center of k-space. The effect of the dephased spin isochromats due to movement in the high k-space positions is therefore of lesser importance to the reconstructed MR image. A marked improvement in the image quality is thus achieved by the method according to the invention via the reduction of artifacts and the maintenance of the signal strength without having to extend the measurement time.

Figure 5:
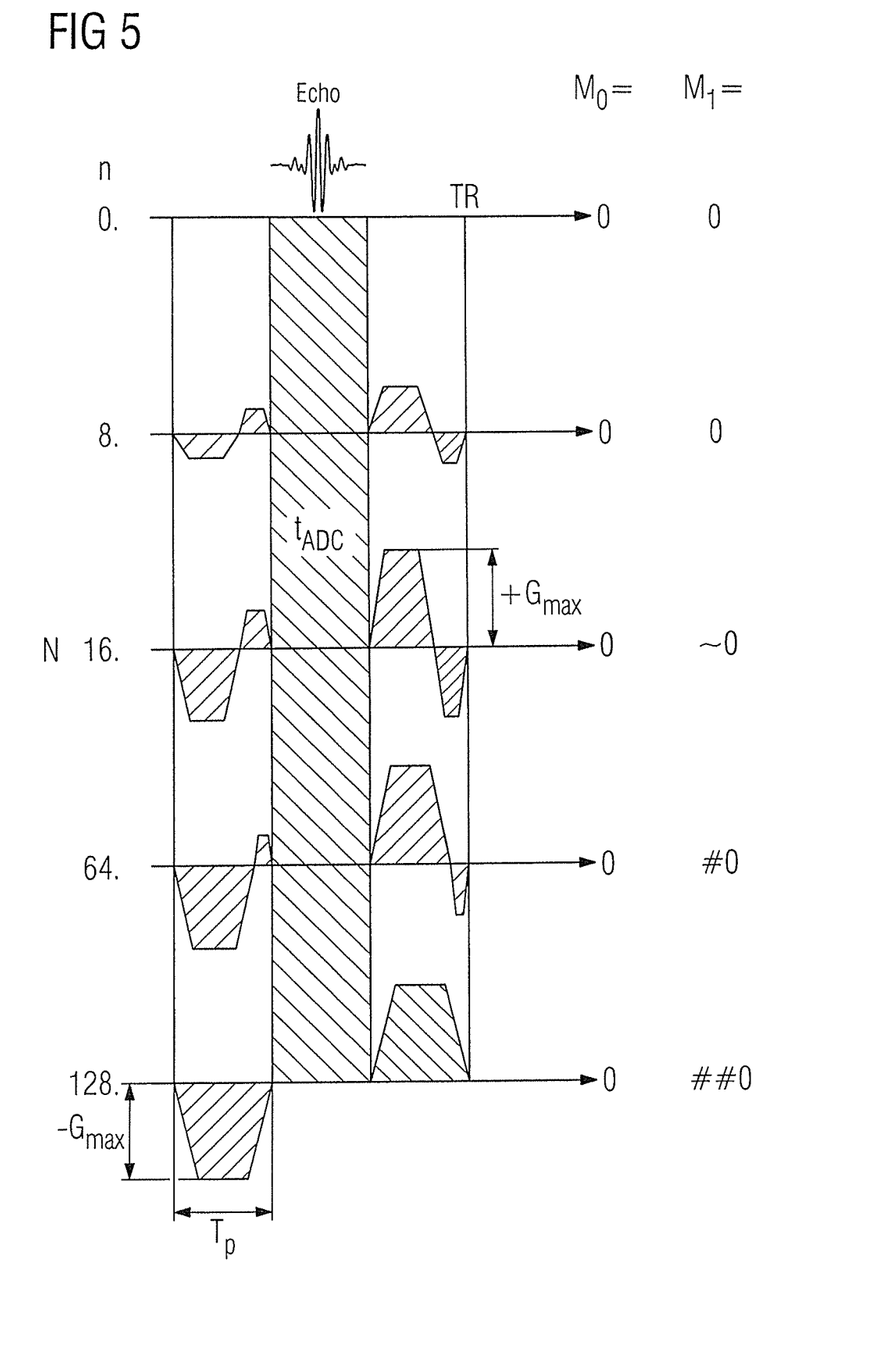
FIG. 5 schematically shows an additional phase coding switching with a movement compensation in the phase direction according to the invention.

An additional phase coding switching with a movement compensation in the phase direction according to the invention is drawn in FIG. 5. In addition to the minimization of the first moment at each point in time TR that has already been proposed with reference to FIG. 4, given the switching of the phase coding gradients shown in FIG. 5 the phase coding gradient is designed such that the first moment of the phase coding gradient is minimal at a point in time TE between the radiation of successive RF excitation pulses.

Analogously to the case described in relation to FIG. 4, the phase coding gradients can be designed such that the first moment of the phase coding gradient at the point in time TE disappears at low k-space positions, and increases continuously with the k-space position n as of a threshold N.

Additional advantages occur via the minimization of the first moment of the phase coding gradients at the point in time TE: on the one hand, in this way no echo dephasing of the signals occurs, which increases the quality of the signals to be measured. On the other hand, what are known as "flow displacement" artifacts also do not occur which otherwise always arise when a flow in a diagonal direction which possesses a component in the direction of the phase coding direction occurs in the imaging area.

An additional improvement of the image quality of the ultimately reconstructed MR image can therefore be achieved.

Figure 6:
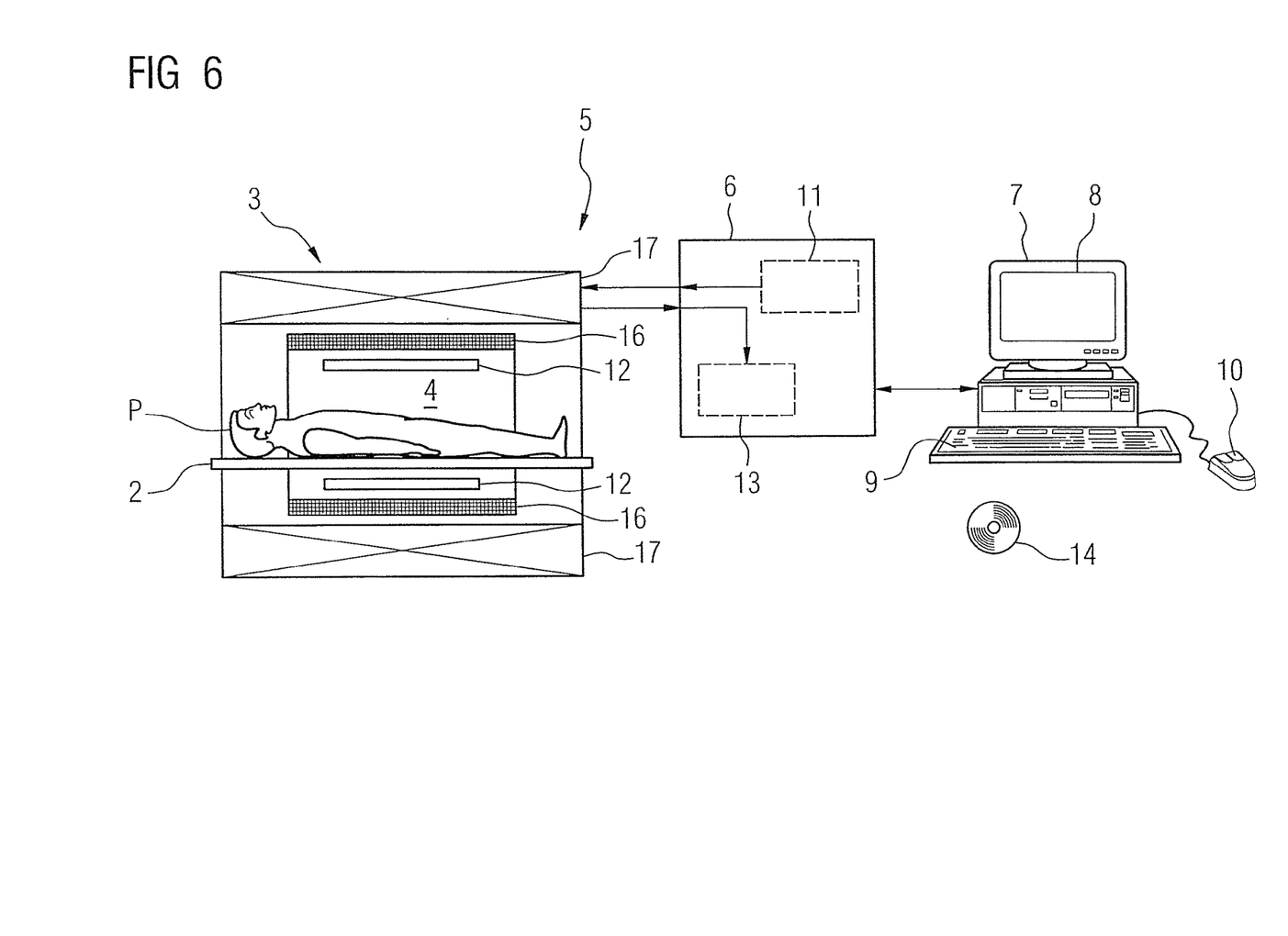
FIG. 6 schematically illustrates a magnetic resonance system according to the invention.

A magnetic resonance system 5 according to the invention is schematically depicted in FIG. 6. The magnetic resonance system 5 has a scanner 3 with a basic field magnet unit 17 and a gradient system with which the magnetic field (including gradient field) necessary for the MR examination is generated in a measurement space 4, a transmission/reception device 12 to transmit RF excitation pulses and receive echo signals, a patient table 2, a control device 6 with which the scanner 3 is controlled and raw data are received from the scanner 3, and a terminal 7 connected to the control device 6.

The control device 6 includes an activation unit 11 and an evaluation device 13. During the creation of an image data set, echo signals are detected by the transmission/reception device 12 from the scanner 3, with the scanner 3, the table 2 and the gradient system 16 and the transmission/reception device 12 being activated by the activation unit 11 such that MR data are acquired by implementing a method according to the invention in a measurement volume 15 that is located inside the body of a patient P lying on the table 2.

The evaluation device 13 receives the acquired echo signals as raw data and stores and processes these. In particular, the evaluation device 13 processes the read-out raw data via reconstruction such that they can be graphically presented on a presentation device 8 (for example on a monitor 8) of the terminal 7. In addition to the graphical presentation of the image data reconstructed from the raw data, with the terminal 7 (which, in addition to the monitor 8, has an input device such as a keyboard 9 and/or a computer mouse 10, for example) a three-dimensional volume segment to be measured can be provided by a user, for example, as an imaging area and additional parameters can be defined for implementation of the method according to the invention. The software for the control device 6 can also be loaded into the control device 6 via the terminal 7. This software of the control device 6 can thereby also embody one of the methods according to the invention. It is also possible for one of the methods according to the invention to be embodied in software that runs in the terminal 7. Independently of where the software that causes execution of the method according to the invention is located, the software can be stored in an electronically readable data storage medium (for example a DVD 14) so that this software can then be read from the DVD 14 by the terminal 7 and be copied either into the control device 6 or into a computer of the terminal 7 itself.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method to acquire magnetic resonance image data from an examination subject located in a magnetic resonance data acquisition unit comprising an RF transmission system and multiple gradient coils, said method comprising:

acquiring magnetic resonance image data from the examination subject in the data acquisition unit by operating the data acquisition unit with a repeated pulse sequence in which RF excitation pulses are respectively radiated at a repetition time interval TR, with a magnetization vector of nuclear spins in the subject being placed in a steady state stable oscillation by said pulse sequence;

in each repetition of said pulse sequence, activating at least one of said gradient coils to radiate a phase coding gradient that codes said magnetic resonance data in a k-space line of k-space, into which said magnetic resonance data are entered;

operating said at least one of said gradient coils to emit said phase coding gradient with a first moment of said phase coding gradient that is minimal at a point in time coinciding with radiation of each RF excitation pulse without extending TR compared to pulse sequences having a non-minimized phase coding gradient; and operating said at least one of said gradient coils to emit said phase coding gradient, in a repetition of said pulse sequence in which said phase coding gradient codes an $n^{th}$ k-space line from a center of k-space, with a first moment that disappears at said point in time of radiation of said RF excitation pulse, wherein n is less than or equal to a threshold N that is dependent on TR to cause said phase coding gradient that codes said $n^{th}$ k-space line from the center of k-space to increase continuously with n at said point in time of radiation of said RF excitation pulse, when n is greater than N.

2. A method as claimed in claim 1 wherein N is dependent on a maximum phase coding gradient amplitude achievable with said at least one of said gradient coils of said data acquisition unit.

3. A method as claimed in claim 1 comprising operating said at least one of said gradient coils to emit said phase coding gradient with said first moment being minimal at a point in time TE between radiation of successive RF excitation pulses.

4. A method as claimed in claim 1 comprising operating said data acquisition unit with a Fast Imaging With Steady State Precession (FISP) sequence as said pulse sequence.

5. A magnetic resonance system comprising:

a magnetic resonance data acquisition unit comprising an RF transmission system and multiple gradient coils;

a control unit configured to operate said data acquisition unit to acquire magnetic resonance image data from an examination subject in the data acquisition unit, with a repeated pulse sequence in which RF excitation pulses are respectively radiated at a repetition time interval TR, with a magnetization vector of nuclear spins in the subject being placed in a steady state stable oscillation by said pulse sequence;

said control unit being configured, according to said pulse sequence, in each repetition of said pulse sequence, to activate at least one of said gradient coils to radiate a phase coding gradient that codes said magnetic resonance data in a k-space line of k-space, into which said magnetic resonance data are entered;

said control unit being configured, according to said pulse sequence, to operate said at least one of said gradient coils to emit said phase coding gradient with a first moment of said phase coding gradient that is minimal at a point in time coinciding with radiation of each RF excitation pulse without extending TR compared to pulse sequences having a non-minimized phase coding gradient; and said control unit being configured to operate said at least one of said gradient coils of said data acquisition apparatus to generate said phase coding gradient, in a repetition of said pulse sequence in which said phase coding gradient codes an $n^{th}$ k-space line from a center of k-space, with a first moment that disappears at said point in time of radiation of said RF excitation pulse, wherein n is less than or equal to a threshold N that is dependent on TR to cause said phase coding gradient that codes said $n^{th}$ k-space line from the center of k-space to increase continuously with n at said point in time of radiation of said RF excitation pulse, when n is greater than N.

6. A non-transitory computer-readable storage medium encoded with programming instructions, said storage medium being loaded into a computerized control system of a magnetic resonance data acquisition unit having an RF transmission system and multiple gradient coils, said programming instructions causing said computerized control unit to operate said data acquisition unit to:

acquire magnetic resonance image data from the examination subject in the data acquisition unit by operating the data acquisition unit with a repeated pulse sequence in which RF excitation pulses are respectively radiated at a repetition time interval TR, with a magnetization vector of nuclear spins in the subject being placed in a steady state stable oscillation by said pulse sequence;

in each repetition of said pulse sequence, activate at least one of said gradient coils to radiate a phase coding gradient that codes said magnetic resonance data in a k-space line of k-space, into which said magnetic resonance data are entered;

operate said at least one of said gradient coils to emit said phase coding gradient with a first moment of said phase coding gradient that is minimal at a point in time coinciding with radiation of each RF excitation pulse without extending TR compared to pulse sequences having a non-minimized phase coding gradient; and operate said at least one of said gradient coils of said data acquisition apparatus to generate said phase coding gradient, in a repetition of said pulse sequence in which said phase coding gradient codes an $n^{th}$ k-space line from a center of k-space, with a first moment that disappears at said point in time of radiation of said RF excitation pulse, wherein n is less than or equal to a threshold N that is dependent on TR cause said phase coding gradient that codes said $n^{th}$ k-space line from the center of k-space to increase continuously with n at said point in time of radiation of said RF excitation pulse, when n is greater than N.

* * * * *